United States Patent [19]
Kondo et al.

[11] Patent Number: 5,853,950
[45] Date of Patent: Dec. 29, 1998

[54] PROCESS FOR MAKING LITHOGRAPHIC PRINTING PLATE

[75] Inventors: Toshiro Kondo; Makiko Oko; Yutaka Araki; Hajime Fujioka, all of Tokyo, Japan

[73] Assignee: Mitsubishi Paper Mills Limited, Tokyo, Japan

[21] Appl. No.: 939,004

[22] Filed: Sep. 26, 1997

[30] Foreign Application Priority Data

| Oct. 31, 1996 | [JP] | Japan | 8-263209 |
| Apr. 8, 1997 | [JP] | Japan | 9-089448 |
| Jul. 31, 1997 | [JP] | Japan | 9-206301 |

[51] Int. Cl.$^6$ ............... G03F 7/07; G03C 8/06; G03C 8/36
[52] U.S. Cl. ............ 430/204; 430/248; 430/488
[58] Field of Search .............. 430/204, 248, 430/488

[56] References Cited

U.S. PATENT DOCUMENTS

| 4,567,131 | 1/1986 | Walkiss | 430/204 |
| 5,273,858 | 12/1993 | Coppens et al. | 430/204 |
| 5,635,330 | 6/1997 | Coppens et al. | 430/204 |

*Primary Examiner*—Richard L. Schilling
*Attorney, Agent, or Firm*—Cushman, Darby & Cushman, IP Group of Pillsbury, Madison & Sutro, LLP

[57] ABSTRACT

Disclosed is a process for making a lithographic printing plate by subjecting a lithographic printing material having physical development nuclei between an aluminum support and a silver halide emulsion layer to exposure and then processing the lithographic printing material at least with a developing solution and a water washing solution in this order, which comprises performing the processing(s) with the developing solution and/or the water washing solution by using the developing solution and/or the water washing solution containing an organic compound which coagulates gelatin.

8 Claims, No Drawings

PROCESS FOR MAKING LITHOGRAPHIC PRINTING PLATE

BACKGROUND OF THE INVENTION

This invention relates to a process for making a lithographic printing plate using an aluminum plate as a support and utilizing the silver complex diffusion transfer process.

Some examples of a lithographic printing plate using the silver complex diffusion transfer process (the DTR process) are described on pages 101 to 130 of André Rott and Edith Weyde, "Photographic Silver Halide Diffusion Processes", published by Focal Press, London and New York (1972).

As described therein, there have been known two kinds of lithographic printing plates using the DTR process, i.e., a two sheet type in which a transfer material and an image-receiving material are separated and a mono-sheet type in which these materials are provided on one support. The two sheet type lithographic printing plate is described in detail in Japanese Provisional Patent Publication No. 158844/1982. Also, the mono-sheet type is described in detail in U.S. Pat. No. 3,728,114.

A mono-sheet type lithographic printing plate using an aluminum plate as a support and utilizing the silver complex diffusion transfer process (hereinafter referred to as "an aluminum lithographic printing plate"), which is the target of the present invention, is described in detail in Japanese Provisional Patent Publications No. 118244/1982, No. 158844/1982, No. 260491/1988, No. 116151/1991 and No. 282295/1992 and U.S. Pat. No. 4,567,131 and No. 5,427,889.

In the above aluminum lithographic printing plate, physical development nuclei are carried on a roughened and anodized aluminum support, and a silver halide emulsion layer is further provided thereon. A general process for making this lithographic printing plate comprises the steps of exposure, development processing, water washing processing (removal of a silver halide emulsion layer, hereinafter merely referred to as "washing processing") and finishing processing.

Specifically, metallic silver image portions are formed on physical development nuclei by development processing, and by washing processing subsequent thereto, a silver halide emulsion layer is removed to expose the metallic silver image portions (hereinafter referred to as "silver image portions") on an aluminum support. Simultaneously, the surface of anodized aluminum itself is exposed as non-image portions.

In order to protect the exposed silver image portions and non-image portions, a finishing solution containing a protective colloid such as gum arabic, dextrin, carboxymethyl cellulose and polystyrenesulfonic acid is coated thereon, i.e., said portions are subjected to the so-called gum coating processing. The finishing solution is also called as a fixing solution or a finisher and generally contains a compound which makes silver image portions oleophilic (hereinafter referred to as "an oleophilic property-imparting agent").

As one of the serious problems of the above process for making an aluminum lithographic printing plate, there may be mentioned a problem of removing gelatin of a silver halide emulsion layer at the time of washing processing. In an aluminum lithographic printing plate, removal of a silver halide emulsion layer by water washing is an extremely important step for completely exposing silver image portions and non-image portions constituted by the surface of aluminum itself. In particular, strong oleophilic property is necessary for the silver image portions which receive ink, and it is necessary to completely remove substances inhibiting oleophilic property, such as gelatin.

In the above washing processing, there has been employed a method of peeling and removing an emulsion layer by spraying a water washing solution (hereinafter merely referred to as "washing solution") at 25° to 35° C. according to the jet system or a method of peeling an emulsion layer by a scrub roller while spraying a washing solution. However, it is difficult to completely remove an emulsion layer by such physical peeling methods, and there is a problem that water retentivity and ink receptivity are lowered.

On the other hand, a washing solution is circulated through a filter, the components of an emulsion layer, which are dissolved out or dispersed in the washing solution, such as gelatin and a silver ion are recovered, and the washing solution is utilized again. Therefore, for the purpose of utilizing the washing solution again, it is preferred to filter the components of the emulsion layer, which are dissolved out or dispersed in the washing solution, with good efficiency. However, under the present circumstances, said components cannot sufficiently be recovered by filtration, which makes the washing solution contaminated. In particular, gelatin dissolved out in the washing solution is easily putrefied, which worsens operational environment. Further, when the amount of gelatin dissolved out in the washing solution is enlarged by running processing, gelatin in the washing solution is adhered again to the surface of aluminum and silver image portions to lower ink receptivity and water retentivity.

SUMMARY OF THE INVENTION

An object of the present invention is to provide a process for making an aluminum lithographic printing plate having excellent ink receptivity and water retentivity, in which the above problems are solved. Another object of the present invention is to provide a plate making process in which emulsion layer components dissolved out or dispersed in a washing solution can be filtered with good efficiency. Still another object of the present invention is to retain the properties of a washing solution and maintain ink receptivity and water retentivity in running processing.

The above objects have been achieved by a process for making a lithographic printing plate by subjecting a lithographic printing material having physical development nuclei between an aluminum support and a silver halide emulsion layer to exposure and then processing the lithographic printing material at least with a developing solution and a water washing solution in this order, which comprises:

performing the processing(s) with the developing solution and/or the water washing solution by using the developing solution and/or the water washing solution containing an organic compound which coagulates gelatin (hereinafter referred to as "the coagulating agent").

DESCRIPTION OF THE PREFERRED EMBODIMENTS

In the following, the present invention is explained in detail.

Gelatin of a silver halide emulsion layer is not substantially cured and therefore can be removed relatively easily. However, it is extremely difficult to completely remove a minute amount of gelatin adhered to the surface of aluminum having microscopic unevenness or a transferred silver image, by water washing. Therefore, the present inventors have studied intensively and consequently found an unexpected effect that gelatin can be easily separated from the surface of aluminum and silver image portions by coagulating gelatin.

It is considered that by incorporating the above coagulating agent into the washing solution, gelatin which has come apart by a scrub roller or the like is coagulated to be easily removed. It is also considered that when the coagulating agent is contained in the developing solution, it is brought into the washing solution to be used in the next step in a state that it is contained in the emulsion layer or the like so that gelatin is coagulated to be easily removed. The coagulating agent may be contained in both of the developing solution and the washing solution.

By incorporating the coagulating agent into the developing solution or the washing solution, the efficiency of recovering gelatin dissolved out in the washing solution by filtration is improved, and putrefaction of gelatin by running processing is prevented. Further, when the amount of gelatin dissolved out in the washing solution is made small, gelatin is not adhered again to the surface of aluminum and silver image portions, whereby lowering of ink receptivity and water retentivity (resistance to contamination) by running processing can be prevented.

As the organic compound which coagulates gelatin to be used in the present invention as a coagulating agent, there may be mentioned an anionic organic gelatin-coagulating agent which is used in the step of preparing a silver halide emulsion (a step of coagulation and deposition for desalting a silver halide emulsion by water washing after physical aging). As other organic compounds which coagulate gelatin, there may be mentioned a phosphoric acid compound having polyoxyalkylene units (hereinafter referred to as "the POA-phosphoric acid compound"), and a nonionic compound having at least one of an oxyethylene unit (OE) and a glycerol unit (OG) and having a structural portion which is more hydrophobic than said unit (hereinafter referred to as "the OE-OP compound"). It was not generally known that the POA-phosphoric acid compound and the OE-OP compound have actions of coagulating gelatin. However, it has been found that said compounds exhibit actions of coagulating gelatin in the washing solution and effectively remove gelatin from the surface of aluminum and the surface of a silver image.

As the coagulating agent to be used in the present invention, there may be mentioned, for example, a sulfonated compound of a phenol-aldehyde resin (its sulfonation degree may be a degree necessary for making the above resin water-soluble, and a resin containing bonded sulfuric acid at a weight ratio of 20 to 60% is suitable) described in Japanese Patent Publication No. 16765/1960, a copolymer containing a maleic hydrazide derivative in a main chain (e.g., a copolymer of vinyl acetate and sodium (4-sulfophenyl)hydrazide maleate, a copolymer of styrene and sodium (4-sulfophenyl)hydrazide maleate, a copolymer of vinyl methyl ether and sodium (4-methoxy-3-sulfophenyl)hydrazide maleate, a copolymer of methyl methacrylate and sodium (2-chloro-5-sulfophenyl) hydrazide maleate, a copolymer of methyl acrylate and sodium (3-sulfo-4-methylphenyl)hydrazide maleate and a copolymer of acrylamide and sodium (3-sulfo-4-phenoxyphenyl)hydrazide maleate) described in Japanese Patent Publication No. 43429/1971, a copolymer of p-vinylbenzenesulfonate and other vinyl compound (e.g., acryloylmorpholine, morpholinomethylacrylamide, 1-vinyl-2-methylimidazole and ethoxymethylacrylamide) described in German Patent No. 1547829, a homopolymer of 2-acrylamide-2-methylpropanesulfonic acid or a copolymer of the same and other vinyl compound (e.g., acryloylmorpholine, morpholinomethylacrylamide, 1-vinyl-2-methylimidazole, ethoxymethylacrylamide and 1-vinylpyrrolidin-5-one) described in U.K. Patent No. 1485593, poly-$\beta$-naphthomethylenesulfonic acid described in Japanese Provisional Patent Publication No. 7321/1979, polystyrenesulfonic acid and a derivative thereof, non-polymerized sulfonic acid, for example, naphthalenedisulfonic acid and a derivative thereof, long chain alkylsulfonic acid and the like described in Japanese Provisional Patent Publication No. 263031/1991, and a maleic acid copolymer described in U.S. Pat. No. 2,772,165 and U.K. Patent No. 648472.

Also, there may be mentioned a polymer having a recurring unit represented by the following formula:

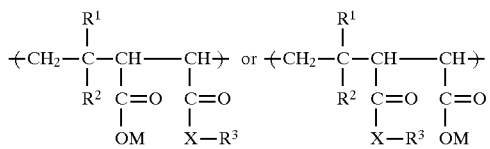

wherein $R^1$ and $R^2$ may be the same or different and each represent an aliphatic group (e.g., an alkyl group having 1 to 16 carbon atoms); $R^3$ represents a hydrogen atom, an aliphatic group (e.g., an alkyl group having 1 to 18 carbon atoms, an alkenyl group and an aralkyl group) or an aromatic group (e.g., a phenyl group); X represents —O— or —NH—; M represents a hydrogen atom, an alkali metal or a cation such as ammonium; and X and $R^3$ may be linked to each other to form a cyclic (e.g., 5- or 6-membered cyclic) amino group,
described in U.S. Pat. No. 4,087,282, and a polymer having a recurring unit represented by the following formula:

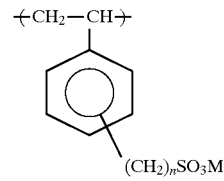

wherein M represents a hydrogen atom, an alkali metal or a cation such as ammonium; and n represents 1, 2 or 3, described in Japanese Provisional Patent Publication No. 45066/1980.

Among the above coagulating agents, a polymer having an anionic group such as a sulfo group and a carboxy group is preferred, and polystyrenesulfonic acid or a copolymer of polystyrenesulfonic acid and maleic anhydride is particularly preferred.

As an anionic organic gelatin-coagulating agent to be used for the step of desalting by water washing after physical aging, a polymer having a relatively small molecular weight (a weight average molecular weight of several thousands to several ten thousands) is generally used. However, the molecular weight of the anionic organic gelatin-coagulating agent to be used in the present invention is not limited, and a wide range of the molecular weight is used. The amount of the anionic organic gelatin-coagulating agent may be regulated depending on whether the molecular weight is large or small. Therefore, an anionic organic gelatin-coagulating agent having a weight average molecular weight of about several thousands to a million may be used. The anionic organic gelatin-coagulating agents having different molecular weights may be used in combination.

The amount of the above anionic organic gelatin-coagulating agent to be added to the developing solution or the washing solution is preferably 1 to 100 g/liter, more preferably 5 to 50 g/liter.

Next, the POA-phosphoric acid compound is explained in detail. The polyoxyalkylene unit of the phosphoric acid compound having polyoxyalkylene units to be used in the present invention is preferably polyoxyethylene. However, said unit may be polyoxypropylene or may contain both of polyoxypropylene and polyoxyethylene. In the following specific examples, one end of the polyoxyethylene unit undergoes ether linkage with an alkyl group or an aryl group, and the other end is bonded to phosphoric acid. That is, the POA-phosphoric acid compound is phosphoric acid (phosphate) of a polyoxyethylene alkyl or aryl ether. The alkyl group is preferably a straight alkyl group having 5 to 20 carbon atoms and may have an unsaturated bond. The aryl group is phenyl, naphthyl or the like and may have a substituent(s) such as an alkyl group and a sulfonic acid group. The number of the polyoxyethylene units is 2 to about 30, preferably 2 to 20. The polyoxyethylene unit includes a unit in which 1, 2 or 3 polyoxyethylene unit(s) is/are bonded to phosphoric acid. When the number of the polyoxyethylene units is 2 or more, said units may be the same or different from each other. Phosphoric acid may be in the form of a salt such as sodium salt and potassium salt.

Specific examples of the POA-phosphoric acid compound are shown below. A numeral in the parentheses shows the number of the polyoxyethylene (POE) units. Said examples are sodium POE (10) lauryl ether phosphate, sodium POE (4) lauryl ether phosphate, sodium POE (5) cetyl ether phosphate, sodium POE (8) oleyl ether phosphate, di-POE (2) dodecyl ether phosphoric acid, di-POE (4) oleyl ether phosphoric acid, di-POE (6) dodecyl ether phosphoric acid, di-POE (8) dodecyl ether phosphoric acid, di-POE (10) dodecyl ether phosphoric acid, tri-POE (2) lauryl ether phosphoric acid, tri-POE (6) dodecyl ether phosphoric acid, tri-POE (8) dodecyl ether phosphoric acid, tri-POE (10) dodecyl ether phosphoric acid, di-POE (4) nonyl ether phosphoric acid and tri-POE (8) oleyl ether phosphoric acid.

In the present invention, the amount of the POA-phosphoric acid compound to be added to the washing solution or the developing solution is preferably 0.05 to 50 g/liter, more preferably 0.1 to 30 g/liter. When the POA-phosphoric acid compound is added only to the developing solution, its amount to be used is larger than an amount necessary for the washing solution.

Next, the OE-OP compound is explained in detail. In the OE-OP compound to be used in the present invention, the number of the OE unit or the GO unit may be 1, but said unit is preferably 2 or more polyoxyethylenes (POEs) or 2 or more polyglycerols (PGOs). The structural portion which is more hydrophobic than OE and GO is preferably (poly) oxypropylene (POP) unit, but it may be an alkyl group, an aryl group, an alkoxycarbonyl group, an alkenyl group or the like, or may have a structure in which at least two of the POP unit and the groups are complexed. As a specific example, there may be mentioned a copolymer of the POE unit and the POP unit, a compound in which an alkyl group, an aryl group or an alkenyl group is bonded to said copolymer, an ester compound of said copolymer, a compound in which an alkyl group, an aryl group or an alkenyl group is bonded to the POE unit or to the PGO unit, and an ester compound of the POE unit or the PGO unit. The alkyl group, aryl group and alkenyl group include those which undergo ether linkage with the POP unit.

The alkyl group is preferably a straight alkyl group having 3 to 30, preferably 4 to 20 carbon atoms and may have an unsaturated bond. The aryl group is phenyl, naphthyl or the like and may have a substituent(s) such as an alkyl group. The alkenyl group is an allyl group or the like. An ester group having the alkyl group as described above is preferred. There is no upper limit in the number of the OE units or the GO units so long as it is dissolved in the washing solution as the OE-OP compound, and said number is 1 to about 50, preferably 2 to 30.

Specific examples of the OE-OP compound are shown below. A numeral in the parentheses shows the number of the OE units, the GO units or the OP units. Said examples are a POE (3)•POP (24) block polymer, a POE (4)•POP (36) block polymer, a POE (10)•POP (36) block polymer, a POE (5)•POP (5) block polymer, a POE (9)•POP (9) block polymer, a POE (16)•POP (24) block polymer, a POE (30)•POP (10) block polymer, a POE (1)•POP (4) cetyl ether, a POE (20)•POP (8) cetyl ether, a POE (5) nonyl phenyl ether, a POE (15) nonyl phenyl ether, a POE (12)•POP (6) decyl tetradecyl ether, bis(POE (5)•POP (5)-mono-2-ethylhexylether)methane, a POE (10)•POP (10) pentaerythritol ether, a POE (9)•POP (9) n-butyl ether, a POE (20)•POP (20) n-butyl ether, a POE (5)•POP (5) n-nonyl ether, a POE (12)•POP (12) oleyl ether, PGO (6) laurate, PGO (20) laurate, monopaltimic acid POE (20) sorbitan, monooleic acid POE (20) sorbitan, tetraoleic acid POE (40) sorbitol, POE (10) monostearate, a POE (8)•POP (8) distearyl ester, a POE (2)•POP (36)•POE (2) block polymer and a POE (10)•POP (30)•GO (1) block polymer.

In the present invention, the amount of the OE-OP compound to be added to the developing solution or the washing solution is preferably 0.05 to 50 g/liter, more preferably 0.1 to 30 g/liter.

The developing solution to be used in the present invention may contain, in addition to the above coagulating agent, additives such as a developing agent, for example, polyhydroxybenzenes and 3-pyrazolidinones; an alkaline substance, for example, potassium hydroxide, sodium hydroxide, lithium hydroxide and sodium tertiary phosphate; an amine compound; a preservative, for example, sodium sulfite; a viscosity modifier, for example, carboxymethyl cellulose; an antifoggant, for example, potassium bromide; a development modifier, for example, a polyoxyalkylene compound; and a silver halide solvent, for example, thiosulfate, thiocyanate, cyclic imide, thiosalicylic acid and a mesoionic compound. The pH of the developing solution is generally 10 to 14, preferably 12 to 14. Further, the developing solution may contain an oleophilic property-imparting agent which makes a silver image oleophilic. As the oleophilic property-imparting agent, a compound having a mercapto group or a thione group described below is preferred.

The pH of the washing solution to be used in the present invention is about 4 to 9, preferably 8 or less, particularly preferably 7 or less. The washing solution may contain, in addition to the above coagulating agent, a buffer for buffering the solution at a pH of 4 to 7, preferably in the range of 5 to 7, for example, a phosphate buffer, a citrate buffer or a mixture of them. Also, a preservative may be contained in the washing solution. Further, a proteinase is preferably contained in the washing solution, and when the proteinase is used in combination with the gelatin-coagulating agent, gelatin is decomposed and removed more effectively, whereby ink receptivity is further improved.

As the proteinase (hereinafter referred to as "the enzyme") to be used in the present invention, there may be used known vegetable and animal enzymes which can hydrolyze protein such as gelatin. As an example of the enzyme, there may be mentioned pepsin, rennin, trypsin, chymotrypsin, cathepsin, papain, ficin, thrombin, renin, collagenase, bromelain and bacterioproteinase (e.g., Bioprase (trade name) produced by Nagase Sangyo Co., Japan). Among them, trypsin, papain, ficin and bacterioproteinase are particularly preferred. The amount of the enzyme to be contained in the washing solution is suitably about 0.5 to 50 g/liter.

Further, a compound having a mercapto group or a thione group is preferably contained in the washing solution. As the compound having a mercapto group or a thione group, compounds described in Japanese Patent Publication No. 29723/1973 and Japanese Provisional Patent Publication No. 127928/1983 are preferably used. A nitrogen-containing heterocyclic compound having a mercapto group or a thione group is particularly preferred, and there may be mentioned a compound represented by the following formula:

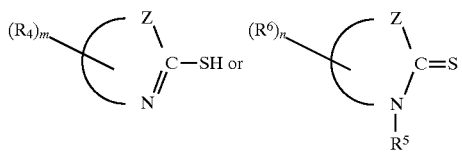

wherein $R^4$ and $R^6$ each independently represent an alkyl group having 3 or more carbon atoms, preferably 3 to 12 carbon atoms, an alkenyl group having 3 or more carbon atoms, preferably 3 to 12 carbon atoms, an acylamide group, an amino group, an aralkyl group or an aryl group; $R^5$ represents a hydrogen atom, an alkyl group having 3 or more carbon atoms, preferably 3 to 12 carbon atoms, an alkenyl group having 3 or more carbon atoms, preferably 3 to 12 carbon atoms, an aralkyl group or an aryl group; m and n each represent an integer of 1 or more, and when $R^5$ is an alkyl group having 3 or more carbon atoms, an alkenyl group, an aralkyl group or an aryl group, n may be 0; and Z represents atomic groups necessary for forming a 5- or 6-membered ring together with N and C in the formula such as C, N, O and S.

As a specific example of the 5- or 6-membered heterocyclic ring, there may be mentioned imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine. The above heterocyclic ring may be a ring produced by condensing two or more rings such as bicyclic, tricyclic, etc. or may be fused with a benzene ring or a naphthalene ring.

As a specific example of the compound having a mercapto group or a thione group, there may be mentioned 2-mercapto-4-phenylimidazole, 2-mercapto-1-benzylimidazole, 2-mercapto-1-butyl-benzimidazole, 1,3-dibenzyl-imidazolidine-2-thione, 2-mercapto-4-phenylthiazole, 3-butyl-benzothiazoline-2-thione, 3-dodecyl-benzothiazoline-2-thione, 2-mercapto-4,5-diphenyloxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-n-heptyl-oxadiazole, 2-mercapto-5-phenyl-1,3,4-oxadiazole, 5-mercapto-1-phenyltetrazole, 3-mercapto-4-methyl-6-phenyl-pyridazine, 2-mercapto-5,6-diphenyl-pyrazine, 2-mercapto-4,6-diphenyl-1,3,5-triazine and 2-amino-4-mercapto-6-benzyl-1,3,5-triazine, but the compound having a mercapto group or a thione group is not limited thereby.

The amount of the compound having a mercapto group or a thione group to be contained in the washing solution is suitably about 0.01 to 10 g/liter, more preferably 0.2 to 4 g/liter.

In the present invention, the above compound having a mercapto group or a thione group is contained in the washing solution to enable recovery of a silver ion dissolved out in the washing solution by filtration and prevent the washing solution from being turbid due to a silver ion. On the other hand, incorporation of the coagulating agent into a processing solution (the developing solution and/or the washing solution) is effective for removing an emulsion layer on an aluminum support with good efficiency as described above. Also, an advantage that gelatin dissolved out at the time of washing processing is easily recovered from the washing solution by a filter is brought about thereby. Therefore, by using the coagulating agent and the compound having a mercapto group or a thione group in combination, emulsion layer components such as gelatin and a silver ion are removed from the washing solution, and the washing solution which is clean without contamination can be utilized again.

When the compound having a mercapto group or a thione group is contained in the washing solution, as a result of effectively removing gelatin by the gelatin-coagulating agent or the gelatin-coagulating agent and the proteinase, adsorption of the compound having a mercapto group or a thione group to a silver image is accelerated to further improve ink receptivity and printing endurance.

The washing solution is used for the purpose of completely removing a silver halide emulsion layer on an aluminum support. In general, a method of spraying a washing solution at 25° to 35° C. according to the jet system or a method of peeling an emulsion layer by a scrub roller while spraying a washing solution is employed.

In order to heighten the respective oleophilic properties and hydrophilic properties of the silver image portions and the non-image portions exposed by washing processing and also in order to protect a plate surface, said portions are subjected to processing using a finishing solution. In the present invention, the finishing solution may preferably contain, in addition to the oleophilic property-imparting agent, a protective colloid such as gum arabic, dextrin, sodium alginate, a propylene glycol ester of alginic acid, hydroxyethyl starch, carboxymethyl cellulose, hydroxyethyl cellulose, polyvinyl pyrrolidone, polystyrenesulfonic acid and polyvinyl alcohol in order to protect an anodized layer of the non-image portions and improve the hydrophilic property thereof.

The lithographic printing plate which is the target of the present invention has physical development nuclei and the silver halide emulsion layer on the aluminum support. A silver halide emulsion is selected from generally used silver chloride, silver bromide, silver iodide, silver chlorobromide, silver chloroiodobromide, silver iodobromide and so on, and an emulsion mainly comprising silver chloride (which means a silver halide emulsion comprising 50 mole % or more of silver chloride) is preferred. The type of the emulsion may be either negative type or positive type. The above silver halide emulsion can be chemically sensitized or spectrally sensitized, if necessary.

As the gelatin to be used in the silver halide emulsion layer, there may be used various gelatins, but alkali-treated gelatin is preferably used. Further, a hydrophilic high molecular weight compound such as polyvinyl pyrrolidone, various starches, albumin, polyvinyl alcohol, gum arabic and hydroxyethyl cellulose can be contained. As the hydrophilic colloid to be used, a hydrophilic colloid substantially containing no hardener is desirably used in order to facilitate peeling of the silver halide emulsion layer after development. The amount of the gelatin to be contained in the silver halide emulsion layer is 1 to 5 g/m$^2$, preferably about 2 to 4 g/m$^2$.

The aluminum support to be used in the present invention is a roughened and anodized aluminum plate, and an aluminum support described in U.S. Pat. No. 5,427,889 is preferably used.

As the physical development nuclei in a physical development nuclei layer to be used in the present invention, known physical development nuclei used in the silver complex diffusion transfer process may be used. As an example thereof, there may be used a colloid of gold, silver or the like, a metal sulfide obtained by mixing a water-soluble salt of palladium, zinc and the like with a sulfide, and so on. As a protective colloid, various hydrophilic colloids may be used. With respect to details of the physical development nuclei and a preparation process thereof, reference can be made to, for example, André Rott and Edith Weyde, "Photographic Silver Halide Diffusion Processes", published by Focal Press, London and New York (1972).

In the present invention, a water-swellable intermediate layer described in Japanese Provisional Patent Publication No. 116151/1991 or an intermediate layer containing hydrophobic polymer beads described in Japanese Provisional Patent Publication No. 282295/1992 may be provided between the physical development nuclei layer and the silver halide emulsion layer.

EXAMPLES

The present invention is described in detail by referring to Examples.

Example 1

According to the methods described in U.S. Pat. No. 5,427,889 which is incorporated as a reference herein, electrolytic roughening treatment and anodization of an aluminum plate were carried out to obtain an aluminum support having a thickness of 0.30 mm and having about 5,600/100 μm$^2$ of pits with a diameter of 0.03 to 0.30 μm on a plateau with an average diameter of about 5 μm, wherein the average diameter of the pits was 0.08 μm. The aluminum support was obtained by being anodized after roughening treatment and had an average roughness (Ra) measured by JIS B 0601 (1994) of 0.5 to 0.6 μm.

On the aluminum support, a physical development nuclei solution comprising silver sol prepared by the Carey Lea method was coated and then dried. The amount of silver contained in a physical development nuclei layer was 3 mg/m$^2$.

As a silver halide emulsion, a silver chloroiodobromide emulsion (20 mole % of AgBr and 0.4 mole % of AgI) having an average particle size of 0.2 μm, with which 0.006 mmole of potassium hexachloroiridate (IV) per 1 mole of silver was doped, was prepared by the control double jet method. As a protective colloid, alkali-treated gelatin was used. Further, the emulsion was subjected to sulfur-gold sensitization and spectrally sensitized by using 3 mg of a sensitizing dye represented by the following formula per 1 g of silver.

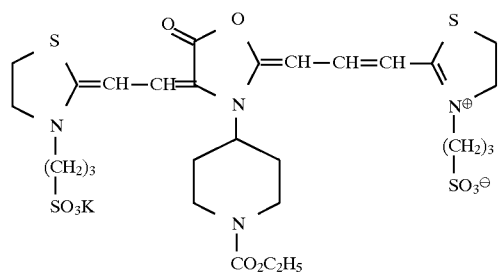

A surfactant was added to the silver halide emulsion prepared as described above, and the mixture was coated on the aluminum support on which the above physical development nuclei had been coated, so that the amount of silver became 2 g/m$^2$ and the amount of gelatin (alkali-treated gelatin) became 3 g/m$^2$, followed by drying, to obtain a lithographic printing material.

On the lithographic printing material, an image was outputted by an outputting machine using a red LD laser of 633 nm as a light source. Then, the lithographic printing material was processed by a processor for plate making (a SLT-N automatic developing machine (trade name) manufactured by Du Pont Co.) to obtain a lithographic printing plate. In the processor for plate making, a step of development processing (dipping at 21° C. for 30 seconds), a step of washing processing (peeling an emulsion layer by a scrub roller while showering and jetting a washing solution at 33° C. for 10 seconds), a step of finishing processing (showering at 21° C. for 5 seconds) and a drying step are carried out. The apparatus for the water washing step is constituted by a tank for storing 30 liter of a washing solution; a unit in which the washing solution is fed from the tank to a lithographic printing material by using a pump and an emulsion layer is peeled and removed; and a unit in which the washing solution is circulated from the tank through a filter provided outside the system. As the filter, a cylindrical filter having a pore size of 5 μm was used.

By using the following developing solutions, washing solutions and finishing solution, 100 plates were processed.

<Developing Solution A>

| | |
|---|---|
| Sodium hydroxide | 20 g |
| Hydroquinone | 20 g |
| 1-Phenyl-3-pyrazolidinone | 2 g |
| Anhydrous sodium sulfite | 80 g |
| Monomethylethanolamine | 6 g |
| Anhydrous sodium thiosulfate | 6 g |
| Sodium ethylenediaminetetraacetate | 5 g |
| Polyethylene glycol (weight average molecular weight: 400) | 10 g |

Made up to 1,000 ml in total with addition of water. The pH was adjusted to 13.0.

<Developing Solution B>

To the above developing solution A was added 10 g of polystyrenesulfonic acid having a weight average molecular weight of 500,000 as a coagulating agent.

<Washing Solution A>

| | |
|---|---|
| Potassium primary phosphate | 40 g |

Made up to 1,000 ml in total with addition of water. The pH was adjusted to 6.0.

<Washing Solution B>

To the above washing solution A was added 10 g of polystyrenesulfonic acid having a weight average molecular weight of 500,000 as a coagulating agent.

<Washing Solution C>

To the above washing solution B was added 2 g of a proteinase (Bioprase AL-15, trade name, produced by Nagase Sangyo Co., Japan).

<Finishing Solution>

| | |
|---|---|
| Gum arabic | 10 g |
| Proteinase | 2 g |
| 2-Mercapto-5-n-heptyl-oxadiazole | 1 g |
| Triethanolamine | 26 g |
| Sodium primary phosphate | 10 g |

Made up to 1,000 ml in total with addition of water. The pH was adjusted to 6.0. The proteinase was Bioprase AL-15.

With respect to the first plates and the 100th plates of the lithographic printing plates prepared by the process described above, ink receptivity (inking) at the time of starting printing was evaluated by using a printer Heidelberg TOK (a trade name of an offset printing press manufactured by Heidelberg Co.), an ink New Champion Black H (trade name, produced by Dainippon Ink Co., Japan) and commercially available damping water for a PS plate. Water retentivity was evaluated by carrying out printing by changing the ink to an ink with low viscosity (New Champion Violet S, trade name, produced by Dainippon Ink Co., Japan). The results are shown in Table 1.

The ink receptivity was evaluated by the number of sheets printed until the density of images became stable after printing was started. The water retentivity was evaluated based on the following 4 ranks by adding isopropyl alcohol (IPA) to the above damping water so as to have a concentration of 15% and observing stain of non-image portions when IPA was gradually reduced. 4 shows that the non-image portions are not stained at all, 3 shows that thin stain of the non-image portions is slightly confirmed, 2 shows that the non-image portions are partially stained, and 1 shows that the whole non-image portions are stained.

TABLE 1

| Sample No. | Developing solution | Washing solution | Ink receptivity First plate | Ink receptivity 100th plate | Water retentivity First plate | Water retentivity 100th plate | Remarks |
|---|---|---|---|---|---|---|---|
| 1 | A | A | 30 sheets | 50 sheets | 2 | 1 | Comparison |
| 2 | B | A | 15 sheets | 18 sheets | 3 | 3 | Present invention |
| 3 | A | B | 16 sheets | 18 sheets | 3 | 3 | Present invention |
| 4 | B | B | 11 sheets | 13 sheets | 4 | 4 | Present invention |
| 5 | B | C | 5 sheets | 7 sheets | 4 | 4 | Present invention |

From the above results, it can be seen that the ink receptivities and water retentivities of the samples of the present invention are excellent than those of the comparative sample. By incorporating the coagulating agent into the developing solution and the washing solution, extremely improved effects are obtained, and further by incorporating the proteinase into the washing solution, ink receptivity is improved. In the comparative sample containing no coagulating agent, ink receptivity and water retentivity are lowered by running processing. However, in the samples of the present invention, neither ink receptivity nor water retentivity are lowered by running processing, and high printing characteristics can be maintained.

Example 2

Procedures were carried out in the same manner as in Example 1 except for changing the coagulating agent of Example 1 to a copolymer of polystyrenesulfonic acid having a weight average molecular weight of 3,000 and maleic anhydride. The similar results as in Example 1 were obtained. The amount of said copolymer was increased to 30 g.

Example 3

The states of contamination of the washing solutions when 100 plates were processed by using the processor for plate making of Example 1, the developing solution A of Example 1 and the washing solution A of Example 1 or the following washing solution D were observed.

<Washing Solution D>

| | |
|---|---|
| 2-Mercapto-5-n-heptyl-oxadiazole | 0.5 g |
| Triethanolamine | 13 g |
| Polystyrenesulfonic acid (weight average molecular weight: 500,000) | 10 g |
| Potassium primary phosphate | 40 g |

Made up to 1,000 ml in total with addition of water. The pH was adjusted to 6.0.

As a result, the washing solution A for comparison was considerably contaminated and turbid and had a putrid smell of gelatin. However, the washing solution D of the present invention was neither contaminated nor turbid, did not have a putrid smell and had significantly improved ink receptivity.

Example 4

The same aluminum support as in Example 1 was used, and a physical development nuclei solution of palladium sulfide containing a small amount of a hydrophilic binder was coated on this aluminum support and then dried. The amount of the PdS nuclei contained in a physical development nuclei layer was 3 mg/m$^2$.

As a silver halide emulsion, a silver chloroiodobromide emulsion (20 mole % of AgBr and 0.4 mole % of AgI) having an average particle size of 0.2 $\mu$m, with which 0.006 mmole of potassium hexachloroiridate (IV) per 1 mole of silver was doped, was prepared by the control double jet method. As a protective colloid, alkali-treated gelatin was used. Further, the emulsion was subjected to sulfur-gold sensitization and spectrally sensitized by using 3 mg of the above red-sensitizing dye per 1 g of silver.

A surfactant was added to the silver halide emulsion prepared as described above, and the mixture was coated on the aluminum support on which the physical development nuclei had been coated, so that the amount of silver became 3 g/m$^2$ and the amount of gelatin became 3 g/m$^2$, followed by drying, to prepare a lithographic printing material.

The above lithographic printing material was subjected to image outputting and plate making processing in the same manner as in Example 1 to prepare a lithographic printing plate.

By using the developing solution A and the finishing solution of Example 1 and the following washing solutions, 100 plates were processed.

<Washing Solution E>

| Potassium primary phosphate | 40 g |
|---|---|

Made up to 1,000 ml in total with addition of water. The pH was adjusted to 6.0.

<Washing Solution F>

To the above washing solution E was added 3 g of polyethylene glycol having a weight average molecular weight of 400.

<Washing Solution G>

To the above washing solution E was added 3 g of dimethyllaurylamine oxide.

<Washing Solution H>

To the above washing solution E was added 3 g of sodium POE (10) lauryl ether phosphate.

<Washing Solution I>

To the above washing solution E was added 3 g of di-POE (10) dodecyl ether phosphoric acid.

<Washing Solution J>

To the above washing solution E was added 3 g of tri-POE (8) oleyl ether phosphoric acid.

The first plates and the 100th plates of the lithographic printing plates prepared by the process described above were tested by the same method as in Example 1. The results are shown in Table 2.

TABLE 2

| Sample No. | Washing solution | Ink receptivity First plate | Ink receptivity 100th plate | Water retentivity First plate | Water retentivity 100th plate | Remarks |
|---|---|---|---|---|---|---|
| 6 | E | 15 sheets | 28 sheets | 2 | 1 | Comparison |
| 7 | F | 14 sheets | 25 sheets | 3 | 2 | Comparison |
| 8 | G | 17 sheets | 26 sheets | 3 | 2 | Comparison |
| 9 | H | 6 sheets | 8 sheets | 4 | 4 | Present invention |
| 10 | I | 5 sheets | 7 sheets | 4 | 4 | Present invention |
| 11 | J | 5 sheets | 8 sheets | 4 | 4 | Present invention |

From the above results, it can be seen that the ink receptivities and water retentivities of the samples of the present invention containing the POA-phosphoric acid compound are excellent than those of the comparative samples. In the washing solutions of the present invention, gelatins dissolved out in said solutions were coagulated and deposited during processing and therefore could be easily removed to the outside of the system. Further, when the washing solutions of the present invention are used, neither ink receptivity nor water retentivity are lowered by running processing, and high printing characteristics can be maintained.

Example 5

The states of contamination of the washing solutions when 100 plates were processed by using the developing solution A of Example 1 and the washing solution E of Example 4 or the following washing solution K were observed.

<Washing Solution K>

| 2-Mercapto-5-n-heptyl-oxadiazole | 0.5 g |
|---|---|
| Triethanolamine | 13 g |
| Polystyrenesulfonic acid (weight average molecular weight: 500,000) | 10 g |
| Tri-POE (2) lauryl ether phosphoric acid | 5 g |
| Potassium primary phosphate | 40 g |

Made up to 1,000 ml in total with addition of water. The pH was adjusted to 6.0.

As a result, the washing solution E for comparison was considerably contaminated and turbid and had a putrid smell of gelatin. However, the washing solution K of the present invention was neither contaminated nor turbid, did not have a putrid smell and had significantly improved ink receptivity.

Example 6

A lithographic printing material was prepared according to Example 4. As a processor for plate making, a SLT-85N automatic developing machine (trade name) manufactured by Du Pont Co.) was used. The constitution of the SLT-85N automatic developing machine was the same as that of the above SLT-N automatic developing machine except for carrying out the step of development processing by dipping at 21° C. for 15 seconds.

By using the developing solution A and the finishing solution of Example 1 and the following washing solutions, 100 plates were processed.

<Washing Solution L>

| Potassium primary phosphate | 40 g |
|---|---|

Made up to 1,000 ml in total with addition of water. The pH was adjusted to 6.0.

<Washing Solution M>

To the above washing solution L was added 1.5 g of polyethylene glycol having a weight average molecular weight of 400.

<Washing Solution N>

To the above washing solution L was added 1.5 g of dimethyllaurylamine oxide.

<Washing Solution O>

To the above washing solution L was added 1.5 g of a POE (5)•POP (5) block polymer.

<Washing Solution P>

To the above washing solution L was added 1.5 g of a POE (15) nonyl phenyl ether.

<Washing Solution Q>

To the above washing solution L was added 1.5 g of bis(POE (5)•POP (5)-mono-2-ethylhexylether)methane.

<Washing Solution R>

To the above washing solution L was added 1.5 g of a PGO (6) laurate.

With respect to the first plates and the 100th plates of the lithographic printing plates prepared by the process described above, ink receptivity (inking) was evaluated by the number of sheets printed until the density of images became stable, by using a printer Heidelberg TOK (a trade name of an offset printing press manufactured by Heidelberg Co.), an ink New Champion Black H (trade name, produced by Dainippon Ink Co., Japan) and commercially available damping water for a PS plate. Water retentivity was evaluated based on the following 4 ranks by observing stain of non-image portions when 100,000 sheets were printed. 4 shows that the non-image portions are not stained at all, 3 shows that thin stain of the non-image portions is slightly confirmed, 2 shows that the non-image portions are partially stained, and 1 shows that the whole non-image portions are stained. The evaluation results are shown in Table 3.

TABLE 3

| Sam-ple No. | Washing solution | Ink receptivity | | Water retentivity | | Remarks |
|---|---|---|---|---|---|---|
| | | First plate | 100th plate | First plate | 100th plate | |
| 12 | L | 15 sheets | 28 sheets | 2 | 1 | Comparison |
| 13 | M | 14 sheets | 25 sheets | 3 | 2 | Comparison |
| 14 | N | 17 sheets | 26 sheets | 3 | 2 | Comparison |
| 15 | O | 5 sheets | 7 sheets | 4 | 4 | Present invention |
| 16 | P | 6 sheets | 9 sheets | 4 | 4 | Present invention |
| 17 | Q | 6 sheets | 7 sheets | 4 | 4 | Present invention |
| 18 | R | 6 sheets | 8 sheets | 4 | 4 | Present invention |

From the above results, it can be seen that the ink receptivities and water retentivities of the samples of the present invention containing the OE-PO compound are excellent than those of the comparative samples. In the washing solutions of the present invention, gelatins dissolved out in said solutions were coagulated and deposited during processing and therefore could be easily removed to the outside of the system. Further, when the washing solutions of the present invention are used, neither ink receptivity nor water retentivity are lowered by running processing, and high printing characteristics can be maintained.

Example 7

The states of contamination of the washing solutions when 100 plates were processed by using the developing solution A of Example 1 and the washing solution L of Example 6 or the following washing solution S in the same manner as in Example 1 were observed.

<Washing Solution S>

| | |
|---|---|
| 2-Mercapto-5-n-heptyl-oxadiazole | 0.5 g |
| Triethanolamine | 13 g |
| Polystyrenesulfonic acid (weight average molecular weight: 500,000) | 10 g |
| POE (10).POP (36) block polymer | 5 g |
| Potassium primary phosphate | 40 g |

Made up to 1,000 ml in total with addition of water. The pH was adjusted to 6.0.

As a result, the washing solution L for comparison was considerably contaminated and turbid and had a putrid smell of gelatin. However, the washing solution K of the present invention was neither contaminated nor turbid, did not have a putrid smell and had significantly improved ink receptivity.

Example 8

To the developing solution A were added 3 g of the OE-OP compounds and the comparative compounds used in the washing solutions M to R of Example 6, respectively, and ink receptivity and water retentivity were tested in the same manner as in Example 1. The ink receptivities and water retentivities of lithographic printing plates processed by using the developing solutions to which the OE-OP compounds of the present invention were added were more excellent than those of lithographic printing plates processed by using the developing solutions to which the comparative compounds were added.

We claim:

1. A process for making a lithographic printing plate by subjecting a lithographic printing material having physical development nuclei between an aluminum support and a silver halide emulsion layer to exposure and then processing the lithographic printing material at least with a developing solution, a water washing solution for removing the silver halide emulsion layer in this order, which comprises:

performing the processing(s) with the developing solution and/or the water washing solution by using the developing solution and/or the water washing solution containing an organic compound which coagulates gelatin.

2. The process according to claim 1, wherein the organic compound which coagulates gelatin is an anionic organic gelatin-coagulating agent.

3. The process according to claim 1, wherein the organic compound which coagulates gelatin is a phosphoric acid compound having polyoxyalkylene units.

4. The process according to claim 1, wherein the organic compound which coagulates gelatin is a nonionic compound having at least one of an oxyethylene unit and a glycerol unit and having a structural portion which is more hydrophobic than said unit.

5. The process according to claim 4, wherein the structural portion which is more hydrophobic than said unit is selected from the group consisting of a polyoxypropylene unit, an alkyl group, an aryl group, an alkoxycarbonyl group and an alkenyl group.

6. The process according to claim 1, wherein the water washing solution has a pH of 8 or less.

7. The process according to claim 1, wherein the water washing solution contains a proteinase.

8. The process according to claim 1, wherein the water washing solution contains a compound having a mercapto group or a thione group.

* * * * *